United States Patent
Huang et al.

(10) Patent No.: US 6,400,014 B1
(45) Date of Patent: Jun. 4, 2002

(54) SEMICONDUCTOR PACKAGE WITH A HEAT SINK

(75) Inventors: Chien-ping Huang, Hsinchu; Cheng-Yuan Lai, Taichung; Tzu-Yi Tien, Taichung; Chih-Ming Huang, Tachia, all of (TW)

(73) Assignee: Siliconware Precision Industries Co., Ltd., Taiwan ( * ) Notice: Subject to any disclaimer, the term of this patent is extended or adjusted under 35 U.S.C. 154(b) by 0 days.

(21) Appl. No.: 09/760,438

(22) Filed: Jan. 13, 2001

(51) Int. Cl.$^7$ ............................................. H01L 23/34
(52) U.S. Cl. ........................................ 257/712; 257/706
(58) Field of Search .................................. 257/706, 710, 257/704, 796, 712; 437/216; 425/125

(56) References Cited

U.S. PATENT DOCUMENTS

| | | | | |
|---|---|---|---|---|
| 5,233,225 A | * | 8/1993 | Ichida et al. | 257/796 |
| 5,329,160 A | * | 7/1994 | Miura et al. | 257/710 |
| 5,482,898 A | * | 1/1996 | Marrs | 437/216 |
| 5,977,626 A | | 11/1999 | Wang et al. | |
| 6,007,317 A | * | 12/1999 | Mess | 425/125 |
| 6,097,089 A | * | 8/2000 | Gaku et al. | 257/712 |
| 6,246,115 B1 | * | 6/2001 | Tang et al. | 257/706 |

* cited by examiner

*Primary Examiner*—David Nelms
*Assistant Examiner*—Thinh T Nguyen
(74) *Attorney, Agent, or Firm*—Peter F. Corless; Steven M. Jensen; Edwards & Angell, LLP

(57) ABSTRACT

The present invention relates to a semiconductor package with a heat sink. There is at least one chip adhered to the substrate and the heat sink is constituted by a planar plate and a support for supporting the planar plate to a height for positioning the planar plate above the chip. The planar plate has a top surface exposed outside a resin body used for encapsulating the chip and the heat sink, and a bottom surface opposed to the top surface. The planar plate further has a thick portion formed on the bottom surface relative to the position of the chip, wherein there is a gap formed between the end surface of the thick portion and the chip to prevent the heat sink from directly contacting with the chip, and an end surface of the thick portion has a plurality of flow channels formed along the flowing direction of the molding gate to avoid the formation of void in the gap so as to increase the yield rate of products.

12 Claims, 2 Drawing Sheets

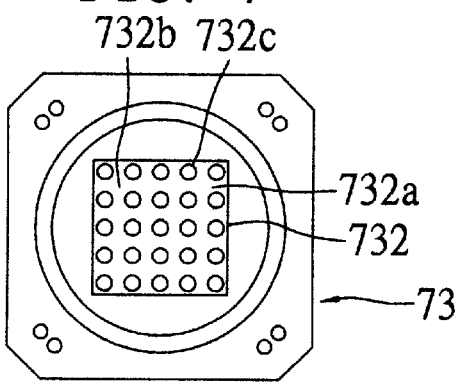
FIG. 7
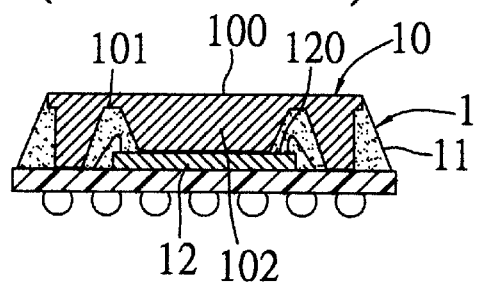
FIG. 8
(PRIOR ART)
FIG. 9
(PRIOR ART)
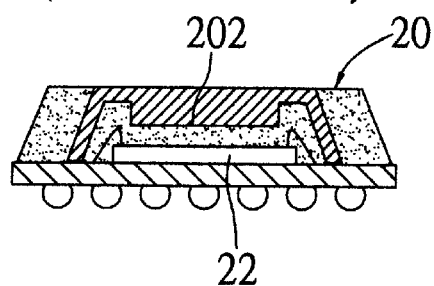
FIG. 10
(PRIOR ART)
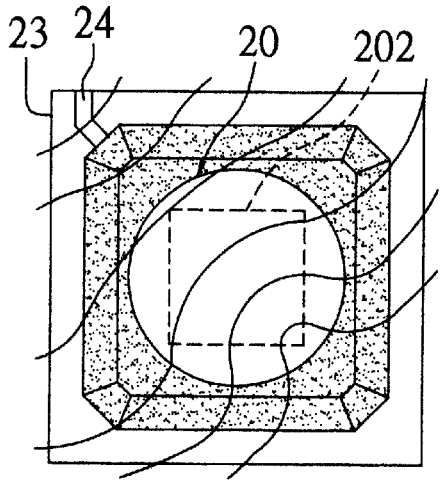
FIG. 11
(PRIOR ART)
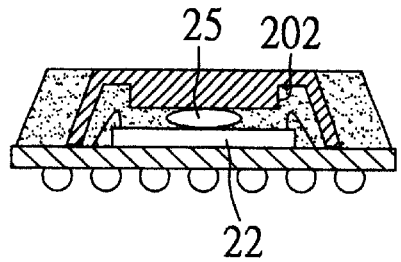

SEMICONDUCTOR PACKAGE WITH A HEAT SINK

FIELD OF THE INVENTION

The present invention is related to a semiconductor package, and particularly to a semiconductor package having a heat sink for enhancing the heat-dissipating efficiency.

BACKGROUND OF THE INVENTION

The reason why the ball grid array (BGA) semiconductor package becomes the main package product is that it can provide sufficient I/O connections to meet the requirement of the semiconductor chip with high-density electronic components and electrical circuits. However, the higher the density of electronic components and electrical circuits on the semiconductor chip, the more the heat generated during the operation. If the heat generated by the semiconductor chip can not be dissipated effectively, the performance and useful life of the semiconductor chip will be affected. Moreover, the high-performance semiconductor chip of the BGA package is typically encapsulated by the encapsulant or resin body. The thermal conductivity K of the resin body is only about 0.8 w/m° K so that its thermal conductivity is very poor. Therefore, the heat generated from the active surfaces of electronic components and electrical circuits laid out on the semiconductor chip can not be effectively dissipated to atmosphere through the transmission of the resin body.

In addition, the coefficient of thermal expansion (CTE) of the material of the semiconductor chip is about 3 ppm/° C. but that of a general resin used for forming the resin body is up to 20 ppm/° C. Thus, after the semiconductor chip is encapsulated by the resin body, under the significant temperature varieties for curing the resin body, for soldering the semiconductor package on the printed circuit board, and for testing the reliability of the semiconductor package in the temperature cycle, the thermal expansion and cold shrinking of the resin body will induce a great thermal stress effect on the semiconductor chip, thereby resulting in the crack of the semiconductor chip. Furthermore, the thicker the resin body, or the tinner or bigger the semiconductor chip, the more significant the thermal stress effect on the semiconductor chip. Therefore, the yield rate of such a conventional semiconductor package still can not be raised effectively.

In order to solve the problem of insufficient heat-dissipating efficiency of the BGA package, it is provided with a heat sink. Although this way of encapsulating the heat sink in the resin body may increase the heat-dissipating efficiency, the path of transmitting the heat generated from the active surface of the semiconductor chip to atmosphere still includes a relatively large portion of the resin body with a poor thermal conductivity. Thus, the entire heat-dissipating efficiency of the semiconductor package can not be increased up to the satisfied degree.

Aiming at the above-described problem existing in the semiconductor package with the heat sink, U.S. Pat. No. 5,977,626 discloses a semiconductor package in which a heat sink is directly adhered to the active surface of the chip. As shown in FIG. 8, this semiconductor package has a heat sink 10 with a top surface 100 exposed out of the resin body 11. There is a protrusion 102 formed on a bottom surface of the heat sink 10 relative to the chip 12. The protrusion 102 is directly adhered to the active surface of the chip such that the heat generated from the active surface of the chip 12 can be transmitted to the heat sink 10 to be dissipated to atmosphere directly from the top surface 100 of the heat sink 10. Because the heat generated by the chip 12 is not transmitted through the resin body 11 and the top surface 100 of the heat sink 10 is exposed in the air, this semiconductor package has a good heat-dissipating efficiency. However, the heat sink of such a semiconductor package 1 is directly adhered to the chip 12 so that the heat sink 10 will be clamped by the mold during molding process. Because of the tolerance in the thickness of the heat sink 10 and the chip 12, thereby resulting in the crack of the chip. This condition may be easily happened when the chip has a tendency to become larger and thinner. Even though there is no tolerance in the thickness of the heat sink 10 and the chip 12, the heat sink 10 made of general copper having the coefficient of thermal expansion (CTE) up to 18 ppm/° C. will still induce a thermal stress effect on the chip 12 having the coefficient of thermal expansion (CTE) of 3 ppm/° C. under the temperature variation of subsequent packaging or the temperature cycle for testing the reliability of the semiconductor package, thereby resulting in the crack of the chip 12.

Therefore, it is desirable to improve the reliability of the semiconductor package 1.

In view of the above-described shortcomings of the conventional semiconductor package, as shown in FIG. 9, there must leave an appropriate distance between the protrusion 202 of the heat sink 20 and the chip 22 to prevent directly from contacting with each other. Although the heat generated by the chip 22 can not be directly transmitted to the heat sink 20, the reliability and manufacturing problem can be solved effectively to redeem the low heat-dissipating efficiency of product. However, as shown in FIG. 10, after the resin flow introduced from a molding gate 24 on a corner of the substrate 23 flows into the gap between the chip 22 and the protrusion 202, the flow speed will be decreased due to the narrow flow channel. Hence, the flow speed of resin flow outside the gap is greater than that of resin flow within the gap, shown as a curve of flow speed in this figure. The uneven flow speed often causes the formation of void 25 in the gap as shown in FIG. 11. The formation of void easily results in the popcorn of such a semiconductor package under the high-temperature surrounding and affects the reliability of product.

SUMMARY OF THE INVENTION

An object of the present invention is to provide a semiconductor package with a heat sink, which has high heat-dissipating efficiency and excellent reliability.

According to the present invention, the semiconductor package includes a substrate; a chip adhered to and electrically connected with the substrate; a heat sink having a planar plate and a support for supporting the planar plate to a predetermined height for positioning the planar plate above the chip, wherein the planar plate has a top surface exposed outside a resin body, and a bottom surface opposed to the top surface and having a thick portion formed relative to the position of the chip, further an end surface of the thick portion having a plurality of flow channels formed along the direction that the resin flows into the molding gate, wherein there is a gap formed between the end surface of the thick portion and the chip; and a resin body encapsulating the chip and the heat sink, wherein the top surface of the heat sink is exposed outside the resin body.

The flow channels are formed by a plurality of slots formed on the end surface of the thick portion or constructed by a plurality of gibbous projections formed on the end surface of the thick portion in an array arrangement in which the gap between any two rows of gibbous projections is formed as a flow channel. The flow channel can effectively prevent the flow speed of the resin flowing through the gap between the thick portion and the chip from slowing down by the narrow space, and thus it can avoid the formation of void in the gap. In addition, the thickness of the resin body between the thick portion and the chip can be reduced. Hence, the heat-transmitting distance in the gap can be shortened to effectively enhance the heat-dissipating efficiency.

BRIEF DESCRIPTION OF THE DRAWINGS

The present invention may best be understood through the following description with reference to the accompanying drawings, in which:

FIG. 7 is a bottom view of further another heat sink used in the semiconductor package of the present invention;

FIG. 8 is a cross-sectional view of a conventional semiconductor package;

FIG. 9 is a cross-sectional view of another conventional semiconductor package;

FIG. 10 is a schematic diagram showing a curve of flow speed of the resin when molding the conventional semiconductor package of FIG. 8; and FIG. 11 is a cross-sectional diagram showing the formation of void between the chip and the heat sink after molding the conventional semiconductor package shown in FIG. 9.

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

Figure 1:
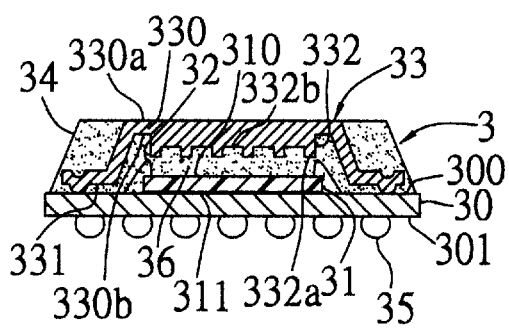
FIG. 1 is a cross-sectional view of the semiconductor package of the present invention.

Please refer to FIG. 1, it is a cross-sectional view of the semiconductor package of the present invention. The semiconductor package 3 includes a substrate 30, a chip 31 adhered to the substrate 30, a plurality of gold wires 32 electrically connected to the substrate 30 and the chip 31, and a heat sink 33 disposed on the substrate 30, a resin body 34 for encapsulating the chip 31, the gold wire 32, and a portion of the heat sink 33, and a plurality of solder balls 35 mounted on the bottom surface of the substrate 30.

The substrate 30 has a top surface 300 for laying out a plurality of metal traces (not shown because this is a well-known design), a bottom surface 301 for laying out a plurality of metal traces, and a plurality of vias (not shown) for electrically connecting the plurality of metal traces on the top surface 300 with those on the bottom surface 301.

The solder balls 35 are respectively mounted at the ends of the metal traces on the bottom surface 301 for electrically connecting the chip 31 and the substrate 30. Therefore, the chip can be electrically connected with an external device such as a printed circuit board through the solder balls 35. The substrate is made of a material selected from a group consisting of epoxy resin, polyimide resin, triazine, a ceramic material, and a glass material, preferably bismaleimide triazine.

The chip 31 has an active surface 310 and an inactive surface 311 for being adhered to the top surface 300 of the substrate 30 by an adhesive such as silver glue or polyimide.

Figure 2:
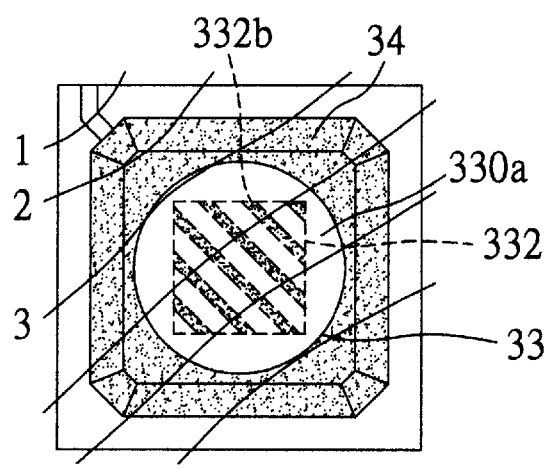
FIG. 2 is a schematic diagram showing a curve of flow speed of the resin when molding the semiconductor package of the present invention.

The heat sink 33 is constructed by a planar plate 330 and a support 331 for supporting the planar plate 330 to a height for positioning the planar plate 330 above the chip 31 to prevent directly from contacting with the active surface 310 of the chip 31. The planar plate 330 has a top surface 330a exposed outside the resin body 34, and a bottom surface 330b opposed to the top surface and integrally having a thick portion 332 formed relative to the position of the chip 31. A gap 36 is formed between the end surface 332a of the thick portion 332 and the active surface 310 of the chip 31 for filling therein the resin body 34, and it prevents the thick portion 332 of the heat sink 33 from pressing the chip 31. In order to avoid that the flow speed of resin flowing into the gap 36 becomes slower and the void is formed in the gap 36 due to too small gap 36, or that too thick resin body 34 filled in the gap 36 affects the heat-dissipating efficiency, a plurality of flow channels 332b are formed on the end surface 332a of the thick portion 332 along the direction of introducing the resin flow, and they can effectively prevent the resin flow flowing through the gap 36 from slowing down by the narrow space and avoid the formation of void in the gap 36. A flowing curve of the resin flow when molding the semiconductor package of the present invention is shown in FIG. 2. Because the flow speed of resin in the gap 36 is not significantly decreased, it is substantially similar to that of resin flow outside the gap 36, thereby preventing the formation of void in the resin body 34.

Figure 4:
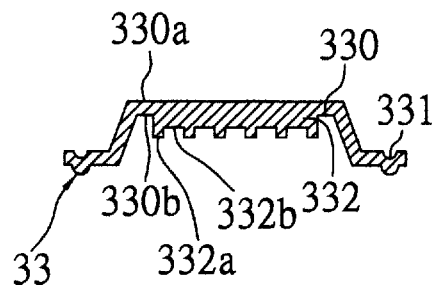
FIG. 4 is a cross-sectional view of the heat sink taken along line 4—4 of FIG. 3.
Figure 3:
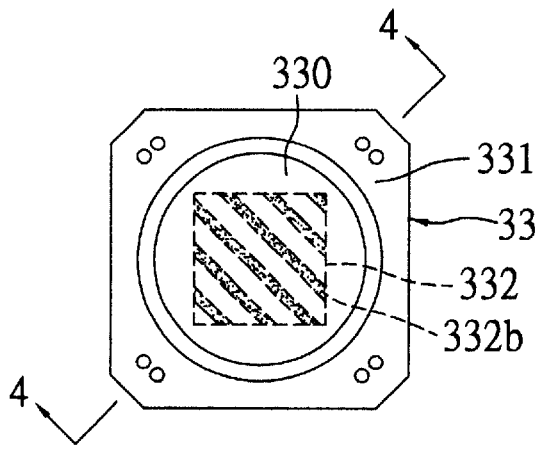
FIG. 3 is a bottom view of a heat sink used in the semiconductor package of the present invention.

As shown in FIGS. 3 and 4, the plurality of flow channels 332b formed on the end surface 332a of the thick portion 332 are constructed by the slots. The depth of the flow channel 332b is not limited particularly but must be sufficient enough to prevent that the flow speed of resin flowing through the gap 36 is significantly reduced and that the void is formed. Moreover, the formation of the flow channels 332b can greatly increase the surface area of the heat sink 33 disposed in the resin body 34. Except that the heat-dissipating area can be increased and the heat-dissipating efficiency can be enhanced, the adherence between the heat sink 33 and. the resin body 34 can also be enhanced due to the increased surface area.

Figure 5:
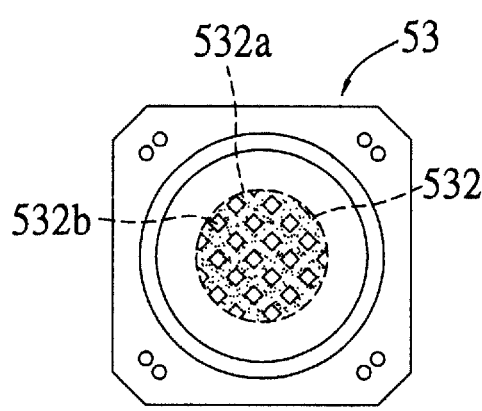
FIG. 5 is a bottom view of another heat sink used in the semiconductor package of the present invention.

Referring to FIG. 5 it is a bottom view of another heat sink, the structure of the heat sink 53 is substantially identical to the above-described structure except that the plurality of flow channels 532b are formed on the end surface of the thick portion in a grid shape, indicated by fine points shown in this figure. The grid-shaped flow channels 532b not only increase the space between the chip (not shown) and the end surface 532a to prevent the formation of void, but also increase the surface area of the heat sink 53 in the resin body (not shown) to enhance the heat-dissipating efficiency and the adherence between the heat sink 53 and the resin body 34.

Figure 6:
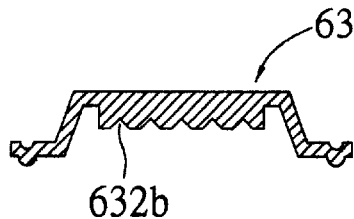
FIG. 6 is a cross-sectional view of another yet heat sink used in the semiconductor package of the present invention.

Referring to FIG. 6, it is a cross-sectional view of another heat sink used in the present invention. The structure of the heat sink 63 is substantially identical to the above-described structure except that the cross-sectional shape for each of the plurality of flow channels 632b is a triangular. Certainly, the cross-sectional shape of flow channels 632b are not limited to those shown in FIGS. 4 and 6. Other regular or irregular shapes are suitable. However, they must be formed along the direction that the resin flows into the molding gate to ensure that the flow speed of resin of the gap between the chip and the thick portion of the heat sink can be prevent from slowing down.

As shown in FIG. 7, it is a top view of another yet heat sink used in the present invention. The structure of this heat sink 63 is substantially identical to the above-described structure except that a plurality of gibbous projections 732c are formed on the end surface 732a of the thick portion 732 in an array arrangement. Along the direction that the resin flows into the molding gate, two adjacent rows of gibbous projections 732c are formed as a flow channel 732b. The shape of gibbous projections 732c is not limited to cylinder as shown. Other shapes such as pier, prism, rhombus or polygon are also suitable. However, the height of gibbous projections must be limited by a predetermined distance between the end of the projections particle 732c and the chip (not shown).

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation, for example, the chip is electrically connected to the substrate in a flip chip manner or at least two chips are adhered on the substrate, so as to encompass all such modifications and similar structures.

What is claimed is:

1. A semiconductor package comprising:

a substrate;

at least one chip adhered to and electrically connected to said substrate;

a heat sink having a planar plate and a support for supporting said planar plate to a height for positioning said planar plate above said chip, wherein said planar plate has a top surface exposed outside a resin body used for encapsulating said chip and said heat sink, and a bottom surface opposed to said top surface and having a thick portion formed relative to the position of said chip, further an end surface of the thick portion having a plurality of flow channels, wherein there is a gap formed between said end surface of said thick portion and said chip; and a plurality of conductive members connected to said substrate and electrically connecting said chip with an external device.

2. The semiconductor package according to claim 1 wherein said plurality of flow channels are constructed by slots formed on said end surface of said thick portion.

3. The semiconductor package according to claim 1 wherein said plurality of flow channels are constructed by slots formed on said end surface of said thick portion in a grid shape.

4. The semiconductor package according to claim 1 wherein said plurality of flow channels are constructed by a plurality of gibbous projections formed on said end surface of said thick portion in an array arrangement.

5. The semiconductor package according to claim 4 wherein said gibbous projections are cylinders.

6. The semiconductor package according to claim 4 wherein said gibbous projections are piers.

7. The semiconductor package according to claim 4 wherein said gibbous projections are prisms.

8. The semiconductor package according to claim 1 wherein the cross-sectional shape for each of said plurality of flow channels is a triangular.

9. The semiconductor package according to claim 1 wherein the cross-sectional shape for each of said plurality of flow channels is a rectangular.

10. The semiconductor package according to claim 1 wherein said chip is electrically connected to said substrate through a plurality of gold wires.

11. The semiconductor package according to claim 1 wherein said chip is electrically connected to said substrate in a flip chip manner.

12. The semiconductor package according to claim 1 wherein said plurality of conductive members are solder balls.

* * * * *